US011333558B2

(12) United States Patent
Jain et al.

(10) Patent No.: US 11,333,558 B2
(45) Date of Patent: May 17, 2022

(54) BOOLEAN TEMPERATURE SENSING USING PHASE TRANSITION MATERIAL

(71) Applicant: GLOBALFOUNDRIES U.S. Inc., Santa Clara, CA (US)

(72) Inventors: Vibhor Jain, Essex Junction, VT (US); Anthony K. Stamper, Burlington, VT (US); John J. Pekarik, Underhill, VT (US); Steven M. Shank, Jericho, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 863 days.

(21) Appl. No.: 16/181,972

(22) Filed: Nov. 6, 2018

(65) Prior Publication Data

US 2020/0141810 A1 May 7, 2020

(51) Int. Cl.
| | | |
|---|---|---|
| *G01K 1/02* | (2021.01) | |
| *H01L 45/00* | (2006.01) | |
| *G01K 7/22* | (2006.01) | |
| *H01L 27/24* | (2006.01) | |
| *H01L 23/522* | (2006.01) | |
| *G01K 7/16* | (2006.01) | |
| *H01L 27/00* | (2006.01) | |
| *H01L 23/482* | (2006.01) | |
| *H01L 27/06* | (2006.01) | |

(52) U.S. Cl.
CPC ............... *G01K 1/02* (2013.01); *G01K 7/16* (2013.01); *G01K 7/22* (2013.01); *H01L 23/5228* (2013.01); *H01L 27/00* (2013.01); *H01L 27/2436* (2013.01); *H01L 27/2463* (2013.01); *H01L 45/06* (2013.01); *H01L 45/1226* (2013.01); *H01L 45/146* (2013.01); *H01L 23/482* (2013.01); *H01L 27/0629* (2013.01); *H01L 45/144* (2013.01); *H01L 45/1675* (2013.01)

(58) Field of Classification Search
CPC ... G01K 1/02; G01K 7/16; G01K 7/22; H01L 27/00; H01L 27/2436; H01L 27/2463; H01L 27/0629; H01L 45/06; H01L 45/1226; H01L 45/146; H01L 45/144; H01L 45/1675
USPC ......................................................... 327/564
See application file for complete search history.

(56) References Cited

U.S. PATENT DOCUMENTS

| | | |
|---|---|---|
| 5,450,053 A | 9/1995 | Wood |
| 5,795,069 A | 8/1998 | Mattes et al. |
| 5,838,187 A | 11/1998 | Embree |
| 5,907,763 A | 5/1999 | Stamper et al. |
| 6,507,021 B1 | 1/2003 | Brood |
| 6,816,351 B1 | 11/2004 | Frank et al. |
| 6,960,744 B2 | 11/2005 | Adkisson et al. |
| 7,544,940 B2 | 6/2009 | Ohkubo et al. |

(Continued)

*Primary Examiner* — Tomi Skibinski
(74) *Attorney, Agent, or Firm* — Francois Pagette; Hoffman Warnick LLC

(57) ABSTRACT

One device disclosed herein includes, among other things, a substrate, a first resistor comprising a first phase transition material formed above the substrate, the first phase transition material exhibiting a first dielectric phase for temperatures less than a first phase transition temperature and a first semiconductor phase for temperatures greater than the first phase transition temperature, and logic to detect a transition of the first resistor to the first semiconductor phase.

20 Claims, 2 Drawing Sheets

(56) References Cited

U.S. PATENT DOCUMENTS

| | | | | |
|---|---|---|---|---|
| 7,724,068 B1* | 5/2010 | Smith | ............... | G01K 3/005 |
| | | | | 327/539 |
| 2008/0285333 A1* | 11/2008 | Lankhorst | ......... | H01L 45/1226 |
| | | | | 365/163 |
| 2009/0001336 A1* | 1/2009 | Habib | ............... | G01K 11/06 |
| | | | | 438/102 |
| 2010/0156588 A1* | 6/2010 | Privitera | ............ | H01L 28/20 |
| | | | | 338/7 |

* cited by examiner

BOOLEAN TEMPERATURE SENSING USING PHASE TRANSITION MATERIAL

BACKGROUND

1. Field of the Disclosure

The disclosed subject matter relates generally to the fabrication of semiconductor devices and, more particularly, to sensing temperature in a Boolean manner using a phase transition material.

2. Description of the Related Art

In modern integrated circuits, a very high number of individual circuit elements, such as field effect transistors in the form of CMOS, NMOS, PMOS elements and the like, are formed on a single chip area. In addition to the large number of transistor elements, a plurality of passive circuit elements, such as capacitors, resistors and the like, are typically formed in integrated circuits that are used for a plurality of purposes, such as for decoupling.

Polysilicon lines may be used in the fabrication of transistors as gate electrodes. A resistor may also be created using a polysilicon line. The resistance of a polysilicon resistor is determined essentially by its length and cross-sectional area. The resistance of a polysilicon resistor changes with temperature, allowing temperature to be estimated during operation of a device. However, variations in contact chain or wiring resistance can lead to temperature sensing inaccuracies.

The present disclosure is directed to various methods and resulting devices that may avoid, or at least reduce, the effects of one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to the fabrication of semiconductor devices and, more particularly, to sensing temperature in a Boolean manner using a phase transition material. One illustrative device includes, among other things, a substrate, a first resistor comprising a first phase transition material formed above the substrate, the first phase transition material exhibiting a first dielectric phase for temperatures less than a first phase transition temperature and a first semiconductor phase for temperatures greater than the first phase transition temperature, and logic to detect a transition of the first resistor to the first semiconductor phase.

Another illustrative devices includes, among other things, first and second circuits defined on a substrate, a first resistor positioned proximate the first circuit and comprising a first phase transition material, the first phase transition material exhibiting a first dielectric phase for temperatures less than a first phase transition temperature and a first semiconductor phase for temperatures greater than the first phase transition temperature, a second resistor positioned proximate the second circuit and comprising a second phase transition material, the second phase transition material exhibiting a second dielectric phase for temperatures less than a second phase transition temperature and a second semiconductor phase for temperatures greater than the second phase transition temperature, and logic coupled to the first and second resistors to generate a first Boolean indicator associated with the first resistor and a second Boolean indicator associated with the second resistor.

One illustrative method includes, among other things, detecting a first transition of a first phase transition resistor from a first dielectric phase to a first semiconductor phase, wherein the first phase transition resistor comprises a first phase transition material exhibiting a first dielectric phase for temperatures less than a first phase transition temperature and the first semiconductor phase for temperatures greater than the first phase transition temperature, and generating a first Boolean indicator associated with the first phase transition resistor responsive to detecting the first transition.

BRIEF DESCRIPTION OF THE DRAWINGS

The disclosure may be understood by reference to the following description taken in conjunction with the accompanying drawings, in which like reference numerals identify like elements, and in which.

Figure 1:
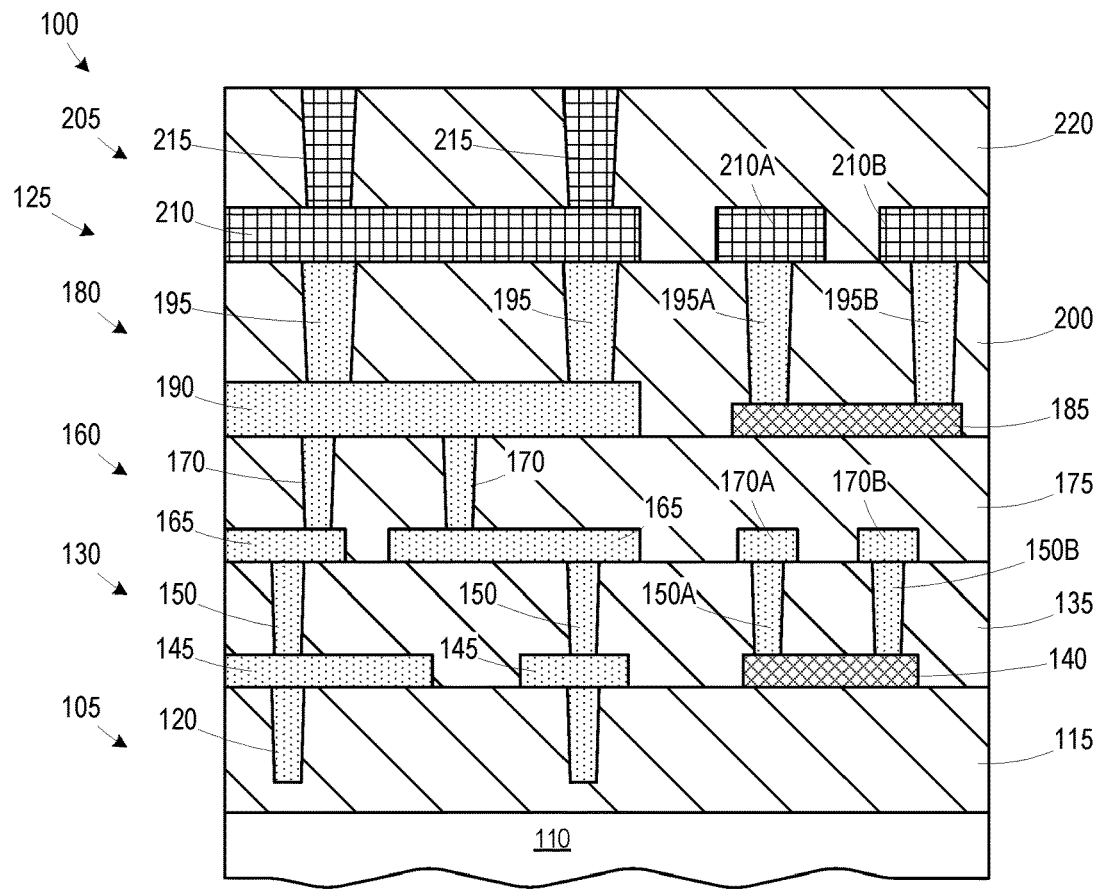
FIG. 1 is a cross-section of a semiconductor device including phase transition material resistors to facilitate Boolean temperature sensing and thermal management.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The present disclosure is directed to various methods of forming an interconnect structure. With reference to the attached drawings various illustrative embodiments of the methods and devices disclosed herein will now be described in more detail.

FIG. 1 is a cross-sectional diagram of a semiconductor product 100. FIG. 1 illustrates the product 100 including a device layer 105 formed in and above a substrate 110 in which semiconductor-based circuit elements may be provided and covered by a dielectric layer 115. For convenience, any such circuit elements are not shown in FIG. 1. In some embodiments, the substrate 110 may be a semiconductor material, glass, sapphire, or some other substrate material. The device layer 105 includes contacts 120 (e.g., tungsten) formed in the dielectric layer 115 for contacting the underlying devices, such as transistors (not shown). The substrate 110 may also include any appropriate microstructure features, such as micromechanical components, optoelectronic components and the like. The device layer 105 may include active or passive devices including but not limited to MOSFET's, SiGe HBT's, NPN's, capacitors, diodes, varactors, resistors, etc. which are electrically contacted by contacts 120.

A metallization system 125 is formed above the device layer 105 to interconnect the various components therein. In highly complex integrated circuits, a very large number of electrical connections may be required and, thus, a plurality of metallization layers may typically be formed in the metallization system 125.

A first metallization layer 130 of the metallization system 125 includes a dielectric layer 135 and one or more phase transition material resistors 140 formed above the device layer 105. According to some embodiments, the phase transition material resistors 140 are formed using phase change materials, such as organic, inorganic, or solid state phase change materials. In some embodiments, the phase transition material resistors 140 include vanadium and oxygen, such as in the form of vanadium dioxide. In some embodiments, other materials, such as various combinations of tellurium (Te), germanium (Ge) and/or antimony (Sb), with doping elements such as indium (In), oxygen (O), selenium (Se), tin (Sn), etc., are used. In some embodiments, the phase transition material resistors 140 may be doped with other materials, such as tungsten, to adjust a phase transition temperature thereof. The phase transition material resistors 140 may be formed by blanket depositing a material layer including at least vanadium and oxygen and patterning the material layer using a photolithography and etch process. Multiple phase transition material resistors 140 may be formed in the metallization layer 130 above different regions of the device layer 105.

Portions of the first metallization layer 130 are formed using a conventional metallization process, such as a dual damascene process or a subtractive etch process, to define conductive lines 145 (e.g., copper for dual damascene or aluminum for subtractive etch) to provide intra-layer signal paths and vias 150 (e.g., copper) to provide inter-layer signal paths. The dielectric layer 135, lines 145, and vias 150 may be formed after patterning the phase transition material resistor(s) 140. Vias 150A, 150B contact the phase transition material resistor 140.

A second metallization layer 160 includes metal lines 165 and vias 170 embedded in a dielectric layer 175. Conductive lines 170A, 170B contact the vias 150A, 150B, thereby providing an interconnection for the phase transition material resistor 140. The conductive lines 170A, 170B may extend into and/or out of the page in FIG. 1.

A third metallization layer 180 also includes a phase transition material resistor 185, metal lines 190, and vias 195 embedded in a dielectric layer 200. Vias 195A, 195B contact the phase transition material resistor 185. In some embodiments, the phase transition material resistor 185 has the same transition temperature as the phase transition material resistor 140. In some embodiments, the phase transition material resistors 140, 185 have different phase transition temperatures. The phase transition material resistors 140, 185 may be doped with differing concentrations of tungsten to provide different phase transition temperatures.

A fourth metallization layer 205 includes metal lines 210 and vias 215 embedded in a dielectric layer 220. Conductive lines 210A, 210B contact the vias 195A, 195B providing an interconnection for the phase transition material resistor 185. The conductive lines 195A, 195B may extend into and/or out of the page in FIG. 1.

The materials for the dielectric layers 125, 175, 200, 220 (e.g., silicon dioxide, low-k dielectric material, ultra-low-k dielectric material, etc.), conductive lines 145, 165, 190, 210 (e.g., metals or metal alloys of tungsten, copper, cobalt, tantalum, ruthenium, aluminum, etc.), and vias 120, 150, 170, 195, 215 (e.g., metals or alloys of the same materials as the conductive lines 145, 165, 190, 210) may vary across the various metallization layers 130, 160, 180, 205. In some embodiments, cap layers (not shown—e.g., SiN, SiCN, etc.) may be formed between the dielectric layers 125, 175, 200, 220 and/or plated metal cap layers, such as CoWP, may be formed over the conductive lines 145, 165, 190, 210. Barrier layers may be formed in conjunction with the conductive lines 145, 165, 190, 210 and vias 120, 150, 170, 195, 215.

Providing phase transition material resistors 140, 185 at different heights, over different regions, or with different phase transition temperatures, allows determination of a temperature profile for the product 100.

Figure 2:
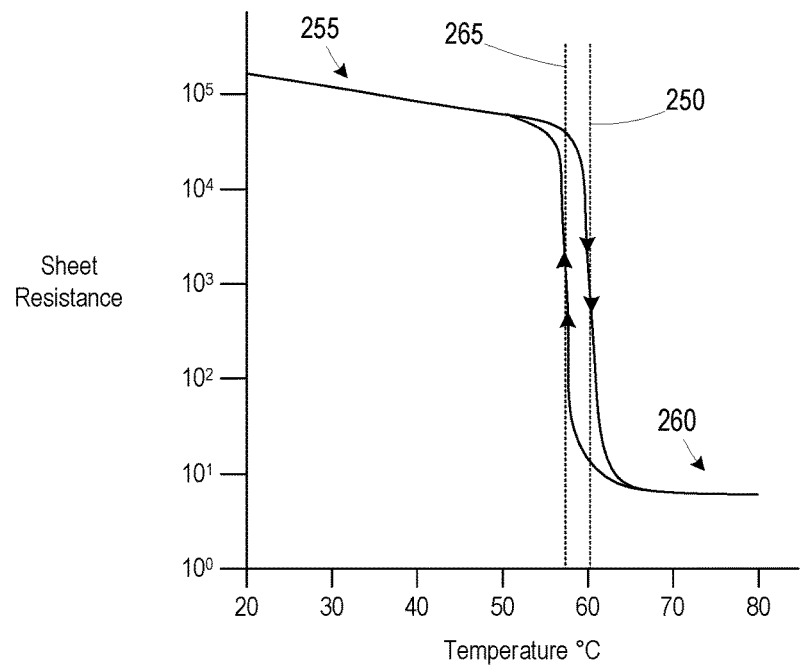
FIG. 2 is a diagram illustrating a temperature versus resistance characteristic curve for the phase transition material resistors in FIG. 1.

FIG. 2 is a diagram illustrating an approximate temperature versus resistance characteristic curve for the phase transition material resistors 140, 185 in FIG. 1. In general, as a temperature of the product 100 rises, the phase transition material resistors 140, 185 undergo a phase transition from being a dielectric material to a semiconductor material at a particular heating transition temperature 250. In some embodiments, a resistance in a dielectric phase 255 drops by about 4 orders of magnitude (e.g., by a factor of about 10,000) after a transition to a semiconductor phase 260. As described in greater detail below, the large order of magnitude resistance difference between the dielectric phase 255 and the semiconductor phase 260 is employed to provide a Boolean indication of a temperature of the product 100 exceeding the transition temperature 250. In the opposite direction (i.e., cooling), a hysteresis may be present such that a cooling transition temperature 265 is lower than the heating transition temperature 250.

Figure 3:
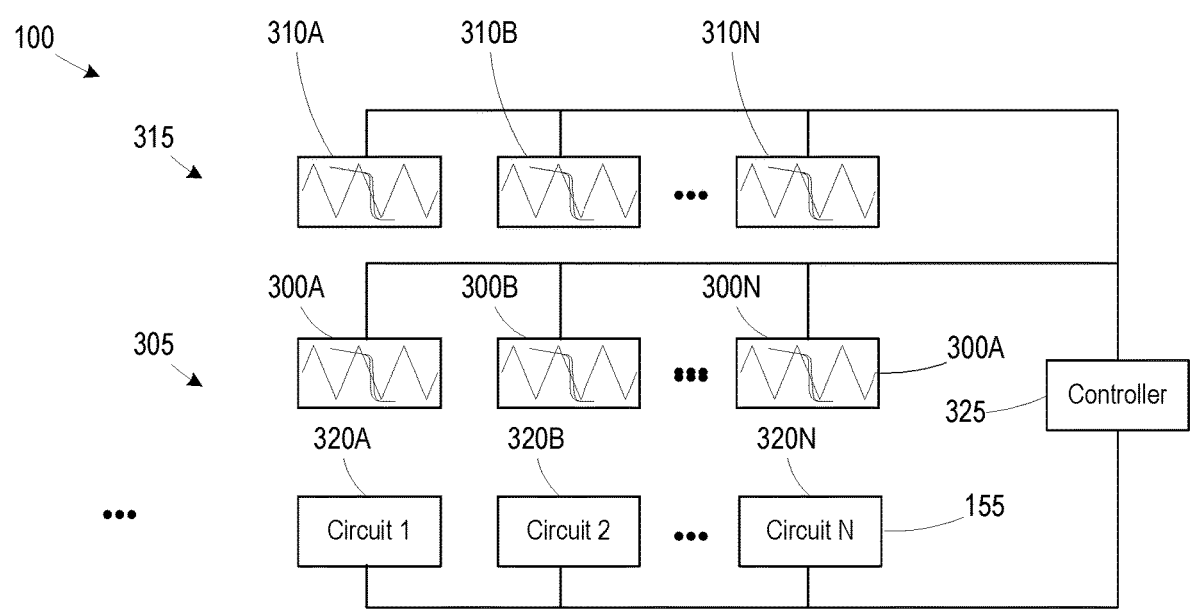
FIG. 3 is a simplified block diagram of the product of FIG. 1.

FIG. 3 is a simplified block diagram of the product 100 of FIG. 1. The product 100 includes phase transition material resistors 300A-300N positioned in a first layer 305 of the product 100 and phase transition material resistors 310A-310N positioned in a second layer 315 of the product 100. In some embodiments, the second layer 315 is above the first layer 305. The phase transition material resistors 300A-300N, 310A-310N may be positioned above different regions of the product 100, represented by circuits 320A, 320B, 320N. The phase transition material resistors 300A-300N, 310A-310N may have the same or different phase transition temperatures. Providing the phase transition material resistors 300A-300N, 310A-310N at different layers and over different regions allows thermal gradient monitoring or mapping of the product 100.

Heat generated by the circuits 320A-320N, ambient heat, and heat transmitted by neighboring devices (not shown) may affect the local temperature at each of the phase transition material resistors 300A-300N, 310A-310N. A controller 325 is connected to the phase transition material resistors 300A-300N, 310A-310N. The controller 325 monitors the resistance of the phase transition material resistors 300A-300N, 310A-310N to detect if a phase transition has occurred. The controller 335 generates a Boolean indicator for the phase transition material resistors 300A-300N, 310A-310N indicating whether they are operating in the dielectric phase or the semiconductor phase. In some embodiments, the circuits 320A-320N and the controller 325 are implemented in the device layer 105 of FIG. 1.

In some embodiments, the controller 325 is also coupled to the circuits 320A-320N to facilitate active power management. If the Boolean temperature indicator generated using the phase transition material resistor(s) 300A-300N, 310A-310N positioned above a certain circuit 320A-320N indicates that the temperature has exceeded a particular threshold (i.e., corresponding to the phase transition temperature), the controller 325 may disable or reduce power consumption (reducing supply voltage, clock frequency, etc.) by the associated circuit 320A-320N to reduce the heat it generates. The controller 325 may also generate a temperature map represented by the Boolean indicators for each of the phase transition material resistors 300A-300N, 310A-310N. The Boolean temperature map may be analyzed off-line to characterize the product 100 and/or to change the design thereof.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
    a substrate;
    a first resistor comprising a first phase transition material formed above the substrate, the first phase transition material exhibiting a first dielectric phase for temperatures less than a first phase transition temperature and a first semiconductor phase for temperatures greater than the first phase transition temperature; and
    logic to detect a transition of the first resistor to the first semiconductor phase.

2. The device of claim 1, wherein the logic is to generate a first Boolean indicator associated with the first resistor responsive to detecting the transition.

3. The device of claim 2, further comprising a first circuit positioned proximate the first resistor, wherein the logic is implemented in a controller, and the controller is to reduce power consumption of the first circuit based on the first Boolean indicator.

4. The device of claim 3, wherein the controller is to disable the first circuit based on the first Boolean indicator.

5. The device of claim 1, further comprising a second resistor comprising a second phase transition material formed above the substrate, the second phase transition material exhibiting a second dielectric phase for temperatures less than a second phase transition temperature and a second semiconductor phase for temperatures greater than the second phase transition temperature, wherein the logic is to detect a transition of the second resistor to the second semiconductor phase.

6. The device of claim 5, wherein the first resistor is positioned above a first region of the substrate, and the second resistor is positioned above a second region of the substrate different from the first region.

7. The device of claim 6, wherein the first phase transition temperature is different than the second phase transition temperature.

8. The device of claim 5, wherein the first resistor is positioned in a first layer above the substrate, and the second resistor is positioned in a second layer positioned above the first layer.

9. The device of claim 8, wherein the first phase transition temperature is different than the second phase transition temperature.

10. The device of claim 1, wherein the first phase transition material comprises vanadium and oxygen.

11. A device, comprising:
    first and second circuits defined on a substrate;
    a first resistor positioned proximate the first circuit and comprising a first phase transition material, the first phase transition material exhibiting a first dielectric phase for temperatures less than a first phase transition temperature and a first semiconductor phase for temperatures greater than the first phase transition temperature;
    a second resistor positioned proximate the second circuit and comprising a second phase transition material, the second phase transition material exhibiting a second dielectric phase for temperatures less than a second phase transition temperature and a second semiconductor phase for temperatures greater than the second phase transition temperature; and
    logic coupled to the first and second resistors to generate a first Boolean indicator associated with the first resistor and a second Boolean indicator associated with the second resistor.

12. The device of claim 11, wherein the logic is to control power consumption by the first circuit or the second circuit based on the first and second Boolean indicators.

13. The device of claim 11, wherein the first phase transition temperature is different than the second phase transition temperature.

14. The device of claim 11, wherein the logic is to disable the first circuit or the second circuit based on the first and second Boolean indicators.

15. The device of claim 11, wherein the first and second phase transition materials comprise vanadium and oxygen.

16. A method, comprising:
- detecting a first transition of a first phase transition resistor from a first dielectric phase to a first semiconductor phase, wherein the first phase transition resistor comprises a first phase transition material exhibiting a first dielectric phase for temperatures less than a first phase transition temperature and the first semiconductor phase for temperatures greater than the first phase transition temperature; and
- generating a first Boolean indicator associated with the first phase transition resistor responsive to detecting the first transition.

17. The method of claim 16, further comprising controlling power consumption by a first circuit positioned proximate the first phase transition resistor based on the first Boolean indicator.

18. The method of claim 17, wherein controlling power consumption of the first circuit comprises disabling the first circuit based on the first Boolean indicator.

19. The method of claim 16, wherein the first phase transition material comprises vanadium and oxygen.

20. The method of claim 16, further comprising:
- detecting a second transition of a second phase transition resistor from a second dielectric phase to a second semiconductor phase, wherein the second phase transition resistor comprises a second phase transition material exhibiting a second dielectric phase for temperatures less than a second phase transition temperature and the second semiconductor phase for temperatures greater than the second phase transition temperature; and
- generating a second Boolean indicator associated with the second phase transition resistor responsive to detecting the second transition.

* * * * *